(12) United States Patent
Depetro

(10) Patent No.: US 6,580,146 B2
(45) Date of Patent: Jun. 17, 2003

(54) INDUCTIVE STRUCTURE INTEGRATED ON A SEMICONDUCTOR SUBSTRATE

(75) Inventor: Riccardo Depetro, Domodossola (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/972,766

(22) Filed: Oct. 5, 2001

(65) Prior Publication Data

US 2002/0056888 A1 May 16, 2002

(30) Foreign Application Priority Data

Oct. 6, 2000 (EP) .......................................... 00830658

(51) Int. Cl.$^7$ ............................................. H01L 29/00
(52) U.S. Cl. ...................... 257/531; 257/415; 257/277; 438/50
(58) Field of Search ............................... 257/415, 531, 257/277; 438/50

(56) References Cited

U.S. PATENT DOCUMENTS

| | | | |
|---|---|---|---|
| 5,874,883 A | 2/1999 | Uemura et al. | 336/200 |
| 6,054,750 A | 4/2000 | Imam et al. | 257/531 |
| 6,093,599 A | 7/2000 | Lee et al. | 438/238 |
| 6,310,387 B1 * | 10/2001 | Seefeldt et al. | 257/531 |

FOREIGN PATENT DOCUMENTS

JP 410321802 A * 12/1998

* cited by examiner

*Primary Examiner*—Sara Crane
*Assistant Examiner*—Junghwa Im
(74) *Attorney, Agent, or Firm*—Lisa K. Jorgenson; Robert Iannucci; SEED IP Law Group PLLC

(57) ABSTRACT

An inductive structure integrated in a semiconductor substrate, comprising at least a conductive element insulated from the substrate, comprising an insulating structure, which is formed inside said semiconductor substrate and built close to said conductor element, so that the resistance of said substrate is increased and the parasitic currents induced by the conductor element in the substrate are decreased. The insulating structure including a plurality of insulating elements each surrounding a respective one of a plurality of semiconductor islands of the substrate.

12 Claims, 4 Drawing Sheets

INDUCTIVE STRUCTURE INTEGRATED ON A SEMICONDUCTOR SUBSTRATE

BACKGROUND OF THE INVENTION

1. Field of the Invention

The present invention relates to an inductive structure integrated in a semiconductor substrate.

The invention specifically concerns an inductive structure integrated in a semiconductor substrate, comprising at least an conductive element on the substrate.

Particularly, but not exclusively, the invention relates to an inductor that is integrated into a SOI (Silicon On Insulator) technology and the following description is made with reference to this application field with the only aim to simplify its explanation.

2. Description of the Related Art

As it is well known, inductors are the most difficult to form in integrated circuits among all the passive electric devices (resistors, capacitors and inductors). In fact, the integrated realization of the inductors requires areas and volumes rather large on silicon, in order to reach the conventionally used inductance values.

A first solution of the prior art to form inductors having high inductance values is the one of forming some planar coils into the semiconductor substrate. It is possible to reach the desired inductance value by forming a proper number of coils.

A second problem, one that appears during the integration of the inductors is the one of obtaining a high quality factor (Q).

In fact, because of the magnetic field associated with the inductance that is integrated into the substrate, parasitic phenomena occur and cause a decrease of the inductance efficiency.

Particularly, Foucault currents which are generated in the silicon substrate tend to counterbalance the magnetic field generated by the current circulating in the inductance.

A solution useful to decrease the influence of such currents is to increase the substrate resistivity.

BRIEF SUMMARY OF THE INVENTION

An embodiment of the present invention is directed to an inductive structure with a high value of the quality factor, which has structural features such to reduce the parasitic currents induced in the substrate, thereby overcoming the limitations that to now are limiting the inductive structures built according to the prior art.

The insulating structure includes a plurality of trench portions formed in a semiconductor substrate and filled with insulating material; and an inductor formed over the insulating structure. The trench portions each surround a respective one of a plurality of semiconductor islands of the substrate.

The features and the advantages of the structure according to the invention will be apparent from the following description of a preferred embodiment thereof, given by way of non-limitative example with reference to the accompanying drawings.

DETAILED DESCRIPTION OF THE INVENTION

Figure 1:
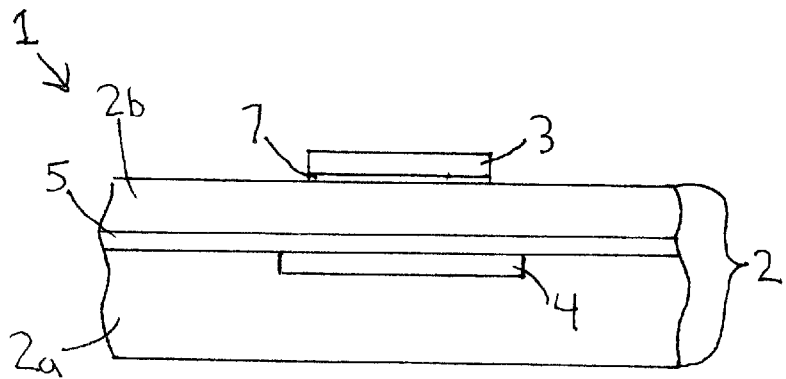
FIG. 1 shows a vertical cross sectional view of a first embodiment of an inductive structure according to the invention.

With reference to such figures, an inductive structure 1 schematically shown that is formed using a semiconductor substrate 2, such as a silicon substrate for example.

The figures show schematic views of some portions of an integrated circuit and are not drawn in scale, but are instead drawn in a way such that the important features of the invention are shown.

The inductive structure 1 comprises an electric conductor 3, which is an inductor patterned like a spiral in order to obtain the desired inductance value. The inductor 3 is positioned on the substrate 2 and is insulated from the substrate by a thin insulating layer 7.

According to an embodiment of the invention, in the substrate 2 at least one insulating structure 4 is formed.

In a first embodiment, such an insulating structure 4 is formed with SOI (Silicon on Insulator) technology. Using SOI technology, the substrate 2 is formed by bonding together a first substrate 2a, covered with an oxide layer 5, and a second substrate 2b, so that the oxide layer 5 remains buried between the first and the second substrate, as shown in FIG. 1.

The domain in which the Foucault currents can flow is limited by forming the inductor 3 on the surface of the second substrate 2b. In such a way the domain is limited and the risk of cross-coupling among different stages of electronic circuits, which are possibly present in the substrate, is eliminated.

Figure 2:
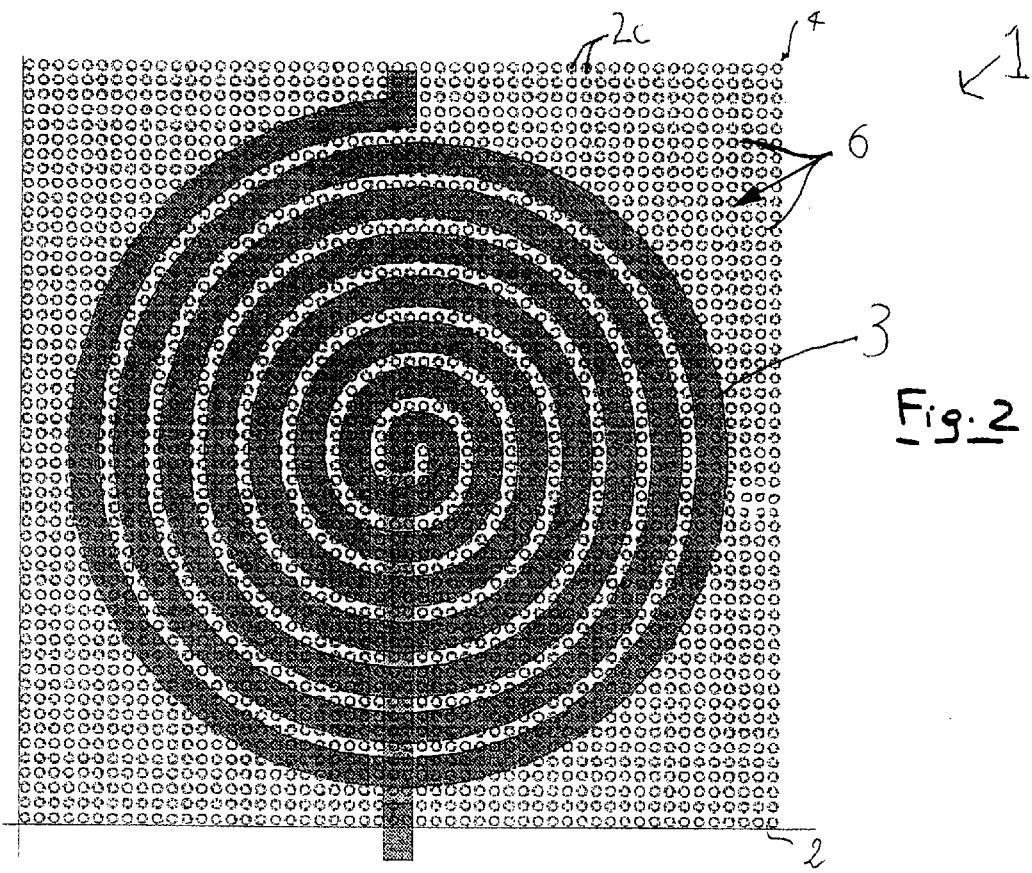
FIG. 2 shows a top view of a second embodiment of an inductive structure according to the invention.

As shown in FIG. 2, the insulating structure 4 includes an array of insulating elements 6 in the semiconductor substrate 2 which are formed in order to increase the equivalent resistance under the inductor 3.

Such elements 6 can be formed through trenches etched in the semiconductor substrate 2 and filled with an insulating material, such as oxide for example.

Such insulating elements 6 can have a substantially cylindrical shape, with a round or multipolygonal profile, and deeply extend in the substrate 2 and delimit silicon islands or semiconductor elements 2c. In such a way the induced magnetic field, which is associated to the Foucault currents provided in the substrate 2, is reduced.

There is nothing to prevent such insulating elements 6 also having a cross sectional annular or ring-like shape, which deeply extends in the substrate 2.

The total insulating structure 4 comprises a matrix of insulating elements 6, which can be formed in a portion or all of the substrate 2 on which the inductor is formed.

Figure 3:
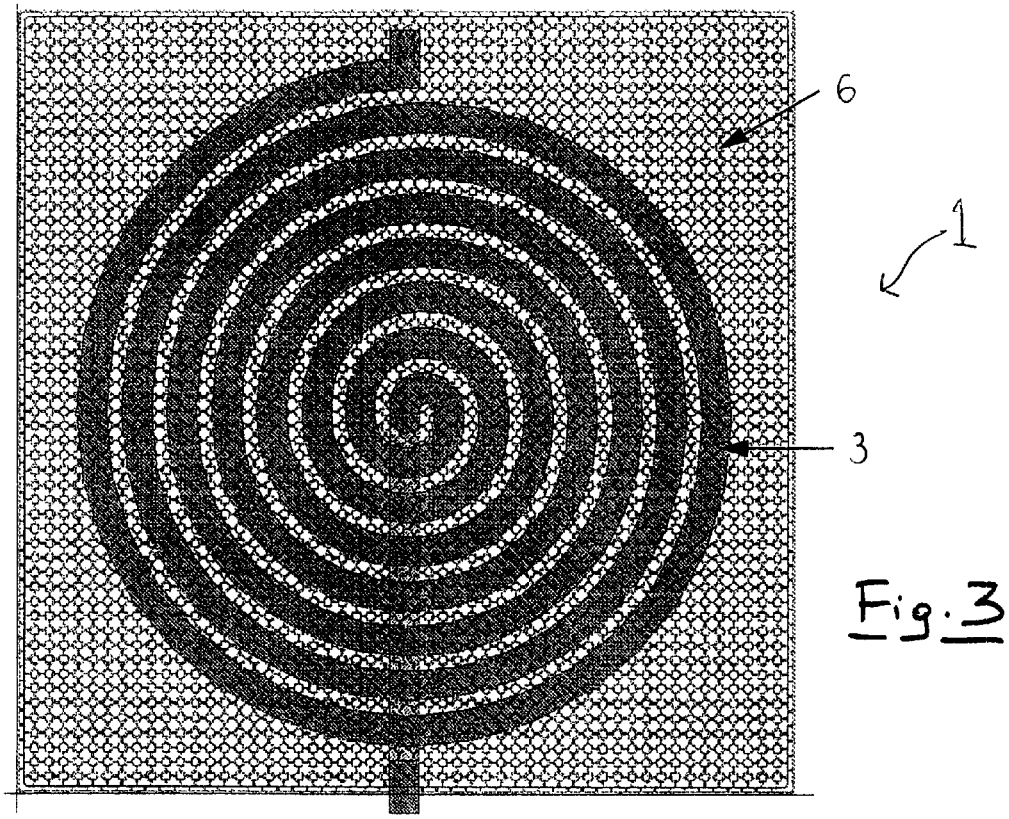
FIG. 3 shows a top view of a third embodiment of an inductive structure according to the invention.
Figure 4:
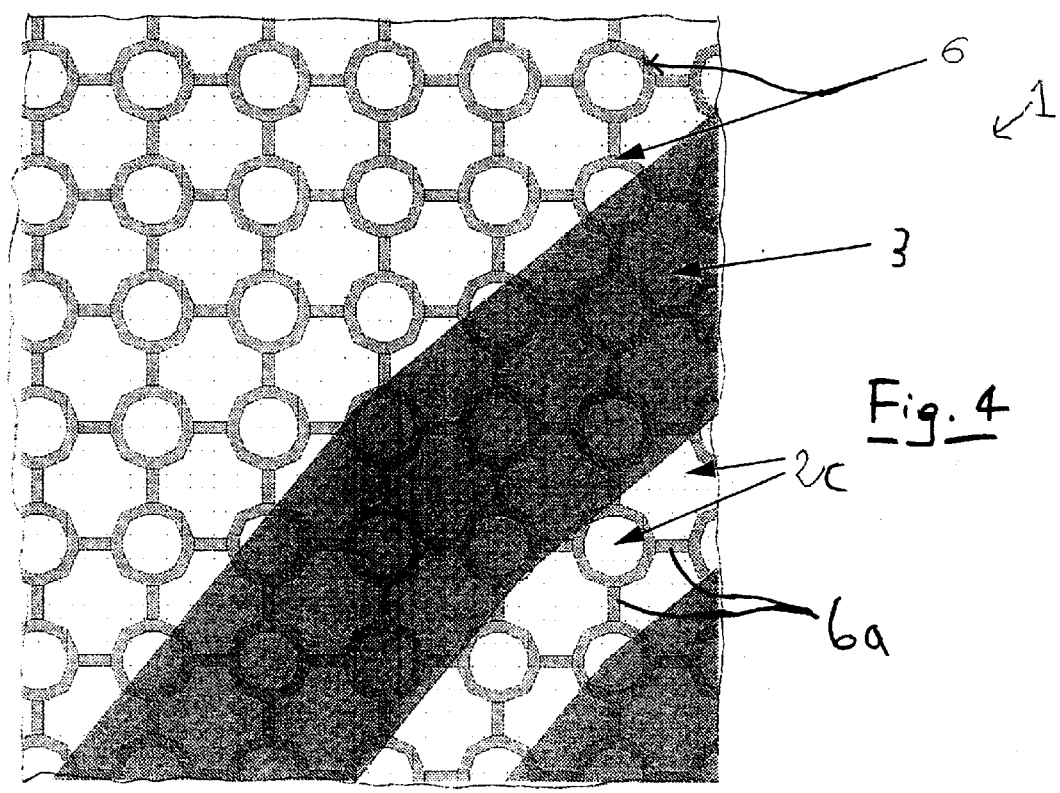
FIG. 4 shows an enlarged scale top view of a substrate portion of the third embodiment of the inductive structure according to the invention.

An improved effect is obtained if the insulating elements 6 are linked with each other by insulating linking elements 6a, as is shown in FIGS. 3 and 4.

For example, the cylindrical structures 6 made out of insulating material can be formed in the substrate 2, which are connected to each other by the insulating linking elements 6a, so that a maze is formed.

The insulating elements 6 are substantially placed in a network with regular structure.

In such a way the plurality of silicon domains 2c are produced, such domains being electrically insulated from each other. In this way each domain 2c will develop a Foucault current in an opposite direction to the current which flows in the inductance. Each domain 2c is surrounded by other insulated domains 2c and the reverse field effect of each of them will be cancelled by the surrounding domains 2c (having the same order of magnitude but on adjacent faces with opposite direction).

In summary, the inductive structure 1 is formed on a portion of substrate 2, which comprises a plurality of semiconductor elements 2c that are separated from each other by at least a trench made in the semiconductor 2, such at least a trench being filled with insulating material so that said plurality of semiconductor elements 2c are at least partially insulated from each other by the insulating elements 6 and the linking elements 6a.

In other words, the substrate portion under the inductor 3 is substantially shaped as mosaic tiles 2c insulated from each other by a trench filled with insulating material, so that the parasitic currents induced into the substrate by the inductor 3 are reduced.

Figure 5:
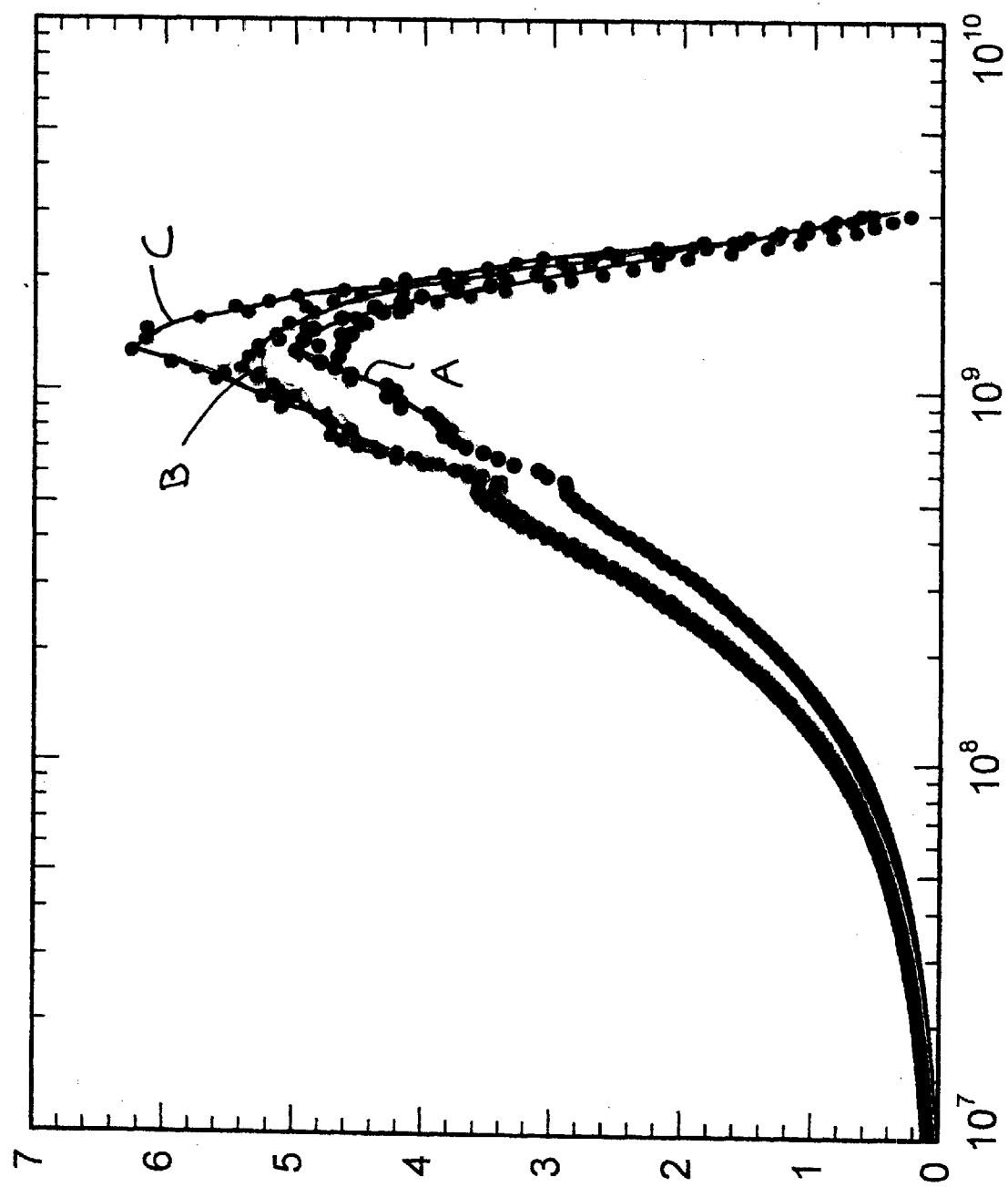
FIG. 5 shows a comparative diagram between three inductive structures of the prior art and the embodiments according to the invention.

The graph of FIG. 5 shows a comparative diagram reporting the pattern of the quality factor in function of the frequency of use for an integrate inductor of the known type and according to the present invention.

Particularly, the curve A shows the pattern of the quality factor in function of the frequency for inductors formed according to the prior art, the curve B shows the pattern of the quality factor in function of the frequency for inductors formed according to the embodiment of FIG. 2, and the curve C shows the pattern of the quality factor in function of the frequency for inductors formed according to the embodiment of FIG. 3.

As it can be appreciated, the testing data also confirms the improvement of the quality factor of inductors formed according to the invention.

It is clear that the insulating structures according to the invention can be formed in a simple substrate or in a SOI technology one.

When the structures according to the invention are formed in a SOI technology, the resistive effect will be further increased if the insulating elements 6 contact the buried oxide layer 5.

The process for forming the inductive structure 1 in a semiconductor substrate will be now described.

However, the hereafter described process steps do not form a complete process flow for manufacturing integrated circuits. The present invention can be put into practice together with integrated structure manufacturing techniques presently used in the field, and only those commonly used process steps that are necessary for the understanding of the present invention are included.

In a semiconductor substrate 2, for example with a conductivity of the P type, a layer of photosensitive material is laid, in which a mask is defined by means of conventional photolitographic processes.

In such a mask the geometry of the insulating structure 4 of the inductive structure 1 is defined.

Therefore, an etching phase of the semiconductor substrate 2a occurs so that the plurality of semiconductor elements 2c separated from each other by trenches 8 formed in such substrate 2a is obtained.

Figure 6:
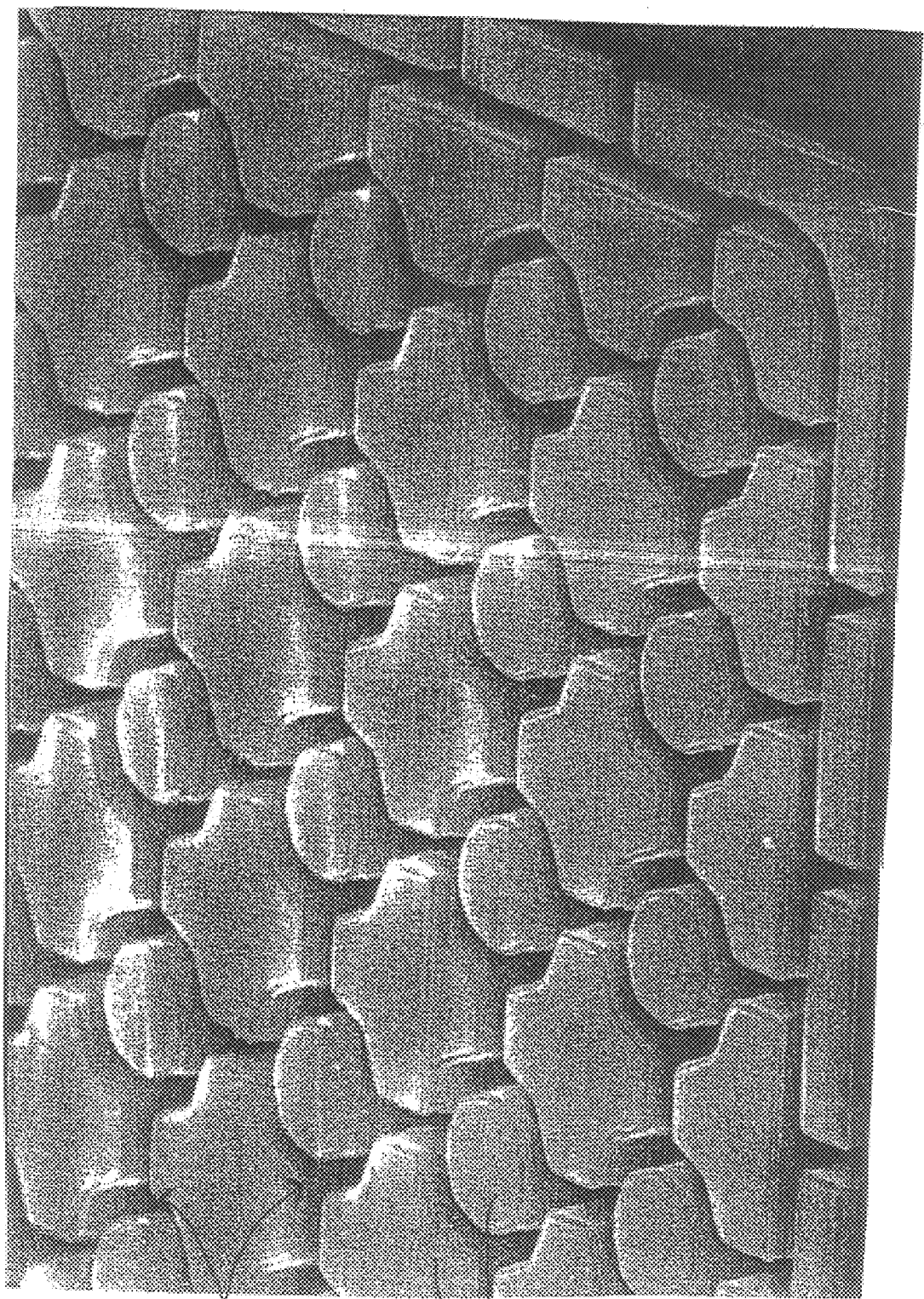
FIG. 6 shows a picture of a substrate portion of the inductive structure according to the invention.

FIG. 6 is a picture, which is made with the electronic microscope, showing a portion of the substrate 2a of the embodiment of FIG. 3, at the end of such etching phase.

Once the mask is removed, an oxide layer is formed inside the trenches made in the substrate in order to form the insulating elements 6 and linking elements 6a of the insulating structure 4.

The insulating elements 6 are placed in reciprocal spaced positions and put in the substrate 2 according to a matrix.

Such elements 6 can substantially have an annular cross-section shape.

In a further embodiment of the invention, such elements 6 are connected to each other by the linking elements 6a in order to form an insulating structure as a regular lattice.

In such a case, the shape of each element can be an annular one. There is nothing to prevent such insulating elements 6 from having a different shape.

The process is therefore completed by means of conventional process steps that comprise:

the formation of the oxide layer 5 on the substrate portion where the insulating structure 4 is formed;

the formation of the second substrate layer 2b on the oxide layer 5;

the formation of the thin insulating layer 7, which may be oxide or other insulating material; and the formation of the inductor 3 through a first or a second metalization layer.

The shape of such inductor depends on the desired inductance value.

As it has been said, there is nothing to prevent such inductive structures 1 being formed without the SOI technology, and, therefore for such process phases to be activated on a unitary substrate without the intervening oxide layer 5. In addition, the inductor 3 could be formed directly on the substrate 2 without the insulating layer 7.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. An inductive structure integrated in a semiconductor substrate, comprising:

a conductive element formed on the substrate; and an insulating structure built inside said semiconductor substrate and in correspondence with said conductive element, in order to increase the resistance of said substrate and decrease parasitic currents, which are induced in the substrate by the conductive element, the insulating structure including a plurality of insulating elements each surrounding a respective one of a plurality of semiconductor islands of the substrate, wherein said insulating elements are substantially cylindrical.

2. The inductive structure integrated in a semiconductor substrate according to claim 1, wherein said insulating structure includes an insulating layer formed between the insulating elements and the conductive element.

3. The inductive structure integrated in a semiconductor substrate according to claim 1, wherein the conductive element is shaped in a spiral pattern.

4. The inductive structure integrated in a semiconductor substrate according to claim 1 wherein said insulating elements are separated from each other by portions of the substrate.

5. The inductive structure integrated in a semiconductor substrate according to claim 1 wherein said insulating elements are interconnected with each other by insulating connectors.

6. The inductive structure integrated in a semiconductor substrate according to claim 1 wherein the substrate is an SOI substrate that includes first and second substrate portions, the substrate islands being part of the first substrate portion, the second substrate portion being positioned on the first substrate portion, and the conductive element being formed on the second substrate portion.

7. An indirective structure, comprising
 a semiconductor substrate having a plurality of semiconductor islands formed in a surface of the substrate, the islands being completely separated from either other by trenches formed in the substrate;
 a conductive element formed on the substrate; and
 a plurality of insulating elements each surrounding a respective one of the semiconductor islands, the insulating elements being positioned in the trenches, wherein the insulating elements are substantially cylindrical.

8. The inductive structure of claim 7, further comprising an insulating layer formed between the insulating elements and the conductive element.

9. The inductive structure of claim 7, wherein the conductive element is shaped in a spiral pattern.

10. The inductive structure of claim 7 wherein the insulating elements are completely separated from each other by portions of the substrate.

11. The inductive structure of claim 7 wherein the insulating elements are interconnected with each other by insulating connectors positioned in interconnecting trenches formed in the substrate.

12. The inductive structure of claim 7 wherein the substrate is an substrate that includes first and second substrate portions, the substrate islands being part of the first substrate portion, the second substrate portion being positioned on the first substrate portion, and the conductive element being formed on the second substrate portion.

* * * * *

UNITED STATES PATENT AND TRADEMARK OFFICE
CERTIFICATE OF CORRECTION

PATENT NO.    : 6,580,146 B2
DATED         : June 17, 2003
INVENTOR(S)   : Riccardo Depetro It is certified that error appears in the above-identified patent and that said Letters Patent is hereby corrected as shown below:

Column 5,
Line 23, "An inderective structure," should read as -- An inductive structure, --.

Column 6,
Lines 20 and 21, "the substrate is an substrate" should read as -- the substrate is an SOI substrate --.

Signed and Sealed this

Eighteenth Day of November, 2003

JAMES E. ROGAN
*Director of the United States Patent and Trademark Office*